United States Patent [19]

Savignac et al.

[11] Patent Number: 5,327,072
[45] Date of Patent: Jul. 5, 1994

[54] REGULATING CIRCUIT FOR A SUBSTRATE BIAS VOLTAGE GENERATOR

[75] Inventors: Dominique Savignac, Ismaning; Manfred Menke, Munich; Dieter Gleis, Grosskarolinenfeld, all of Fed. Rep. of Germany

[73] Assignee: Siemens Aktiengesellschaft, Munich, Fed. Rep. of Germany

[21] Appl. No.: 839,787

[22] Filed: Feb. 21, 1992

[30] Foreign Application Priority Data

Feb. 21, 1991 [EP]  European Pat. Off. ......... 91102555.9

[51] Int. Cl.$^5$ .......................... G05F 3/16; H03L 1/00
[52] U.S. Cl. .................................. 323/313; 307/296.2
[58] Field of Search .................. 323/313, 312; 307/296.2, 296.7, 304, 443; 363/60

[56] References Cited

U.S. PATENT DOCUMENTS

| | | | |
|---|---|---|---|
| 3,964,677 | 6/1976 | Schalow et al. | 236/46 R |
| 4,115,710 | 9/1978 | Lou | 307/304 |
| 4,356,412 | 10/1982 | Moench et al. | 307/304 |
| 4,401,897 | 8/1983 | Martino, Jr. et al. | 307/297 |
| 4,439,692 | 3/1984 | Beekmans et al. | 307/297 |
| 4,461,963 | 7/1984 | Koomen | 307/279 |
| 4,581,546 | 4/1986 | Allan | 307/297 |
| 4,695,746 | 9/1987 | Tobita | 307/297 |
| 4,920,280 | 4/1990 | Cho et al. | 307/296.2 |
| 5,003,197 | 3/1991 | Nojima et al. | 307/296.2 |

FOREIGN PATENT DOCUMENTS 57-121269 7/1982 Japan .
2149251 6/1985 United Kingdom .

OTHER PUBLICATIONS

Research Disclosure, No. 267, Jul. 1986, p. 379, Summary No. 26705, Emsworth, Hampshire, GB; "CMOS hysteresis receiver".
IBM Technical Disclosure Bulletin, vol. 29, No. 3, Aug. 1986, pp. 1353-1354, New York, US.

*Primary Examiner*—Steven L. Stephan
*Assistant Examiner*—Adolf Berhane
*Attorney, Agent, or Firm*—Herbert L. Lerner; Laurence A. Greenberg

[57] ABSTRACT

A regulating circuit for a substrate bias voltage generator for generating a substrate bias voltage in an integrated semiconductor circuit includes a Schmitt trigger circuit disposed between a first potential and a second potential of a semiconductor circuit. The Schmitt trigger circuit has an output side and an input for controlling a hysteresis function of the Schmitt trigger circuit. An inverter array is connected downstream of the output side of the Schmitt trigger circuit. The inverter array is connected to the first potential and to a first supply potential of the semiconductor circuit in terms of supply voltage, and the inverter array has an output. The input of the Schmitt trigger circuit for controlling the hysteresis function of the Schmitt trigger circuit is connected to the output of the inverter array.

25 Claims, 3 Drawing Sheets

REGULATING CIRCUIT FOR A SUBSTRATE BIAS VOLTAGE GENERATOR

The invention relates to a regulating circuit for a substrate bias voltage generator, for generating a substrate bias voltage in an integrated semiconductor circuit.

In modern integrated semiconductor circuits, particularly in semiconductor memories and microprocessors, the substrate of the circuit is often kept at an electrical potential that is not identical to the typical supply voltages VDD, VSS of the semiconductor circuit, by means of a substrate bias voltage. Such a bias voltage is currently not supplied from outside through a chip terminal (as was usually done in the past) but rather it is generated "on chip" by means of a substrate bias voltage generator. In order to enable the substrate bias voltage VBB to be kept within limits specified by component specifications, a regulating circuit is provided to regulate the substrate bias voltage generator and thus to regulate the substrate bias voltage VBB.

U.S. Pat. No. 4,581,546 discloses a substrate bias voltage generator with an associated regulating circuit. That regulating circuit substantially includes a flip-flop circuit including cross-coupled transistors and an associated comprehensive peripheral circuit.

It is therefore seen that the prior art devices have required a large surface area and a relatively large amount of switch elements.

It is accordingly an object of the invention to provide a regulating circuit for a substrate bias voltage generator, which overcomes the hereinafore-mentioned disadvantages of the heretofore-known devices of this general type, which has as few switch elements as possible and which requires as little surface area as possible.

With the foregoing and other objects in view there is provided, in accordance with the invention, a regulating circuit for a substrate bias voltage generator for generating a substrate bias voltage in an integrated semiconductor circuit, comprising a Schmitt trigger circuit disposed between a first potential and a second potential of a semiconductor circuit, the Schmitt trigger circuit having an output side and an input for controlling the hysteresis function that every Schmitt trigger circuit has; a first inverter array connected downstream of the output side of the Schmitt trigger circuit, the first inverter array being connected to the first potential and to a first supply potential of the semiconductor circuit in terms of supply voltage, and the first inverter array having an output; the input of the Schmitt trigger circuit for controlling the hysteresis function of the Schmitt trigger circuit being connected to the output of the first inverter array.

In accordance with another feature of the invention, there is provided a second inverter array connected downstream of the first inverter array.

In accordance with a further feature of the invention, the second inverter array is connected to the first supply potential and to a second supply potential of the semiconductor circuit in terms of supply voltage.

In accordance with an added feature of the invention, the first potential is a second supply potential of the semiconductor circuit.

In accordance with an additional feature of the invention, the first potential is a regulated potential being lower than a second supply potential of the semiconductor circuit.

In accordance with yet another feature of the invention, the Schmitt trigger circuit includes a resistor network being disposed between the first potential and the second potential, the resistor network having at least first, second and third series-connected resistor elements, a first circuit node of the regulating circuit between the first resistor element and the second resistor element, and a second circuit node of the regulating circuit between the second resistor element and the third resistor element.

In accordance with yet a further feature of the invention, at least one of the resistor elements is a transistor.

In accordance with yet an added feature of the invention, the transistor of at least one of the resistor elements is of the p-channel type and has a gate connected to the first supply potential.

In accordance with yet an additional feature of the invention, the transistor of at least one of the resistor elements is of the n-channel type and has a gate connected to the first potential.

In accordance with again another feature of the invention, the transistor of at least one of the resistor elements has a gate and a drain being interconnected.

In accordance with again a further feature of the invention, at least one of the resistor elements is an ohmic resistor.

In accordance with again an added feature of the invention, the second potential is a substrate bias voltage.

In accordance with again an additional feature of the invention, the third resistor element is an n-channel transistor having a gate connected to the first supply potential.

In accordance with still another feature of the invention, the second potential is the first supply potential, and the third resistor element is a p-channel transistor having a gate connected to a substrate bias voltage.

In accordance with still a further feature of the invention, there is provided at least one further resistor element disposed between the second circuit node and the third resistor element.

In accordance with still an added feature of the invention, there is provided a hysteresis transistor having a gate at the input of the Schmitt trigger circuit, for controlling the hysteresis function.

In accordance with still an additional feature of the invention, the hysteresis transistor has a channel path disposed between the first potential and the first circuit node.

In accordance with another feature of the invention, the hysteresis transistor has a channel path disposed between the second supply potential and the first circuit node.

In accordance with a further feature of the invention, the hysteresis transistor serves as the first resistor element having an infinite resistance in a blocked state.

In accordance with an added feature of the invention, the inverter array includes an odd number of inverters, and the hysteresis transistor is of the p-channel type.

In accordance with an additional feature of the invention, the inverter array includes an even number of inverters, and the hysteresis transistor is of the n-channel type.

In accordance with yet another feature of the invention, the second inverter array includes at least one inverter.

In accordance with a concomitant feature of the invention, there is provided a constant current source supplying the first potential.

Other features which are considered as characteristic for the invention are set forth in the appended claims.

Although the invention is illustrated and described herein as embodied in a regulating circuit for a substrate bias voltage generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
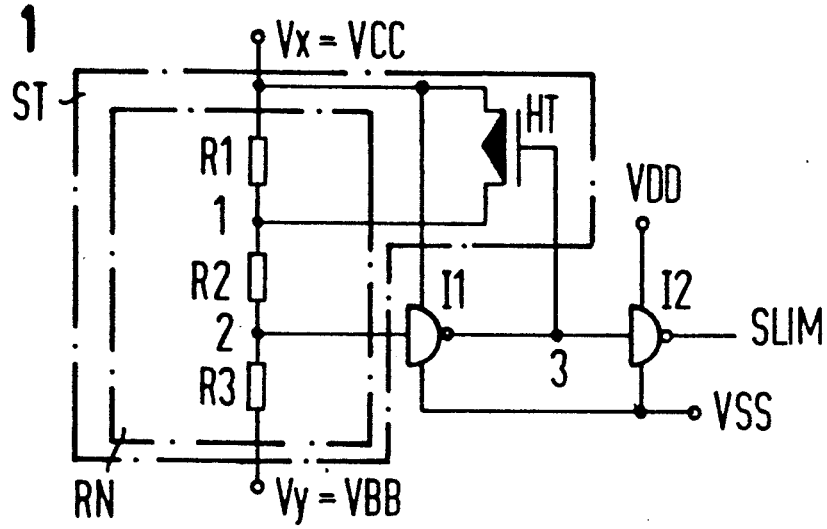
FIGS. 1 and 10-12 are schematic circuit diagrams showing advantageous embodiments of the invention.

Referring now to the FIGURES of the drawing in detail and first, particularly, to FIG. 1 thereof, there is seen a terminal for a first potential Vx of a semiconductor circuit that contains a regulating circuit. The first potential Vx may be a supply potential VDD that is typical for a semiconductor circuit. Such a potential is typically 5 V and is referred to below as the "second supply potential VDD". However, it may also be a regulated potential VCC, which is lower than the (second) supply potential VDD. In the case of a semiconductor circuit in the form of modern integrated semiconductor memories, since the structures are becoming increasingly smaller in the mean time, it has become usual to apply the (until now already typical) supply potential VDD=5 V to the semiconductor circuit, but to use a regulated potential VCC inside the chip (for instance for the cell fields) that is derived from the (second) supply potential VDD and is lower than the supply potential VDD (for instance, VCC=3.3 V). An advantage of the use of this regulating potential VCC is that the regulating circuit is decoupled from any possible fluctuations in the supply potential VDD, so that more accurate regulating of a substrate bias voltage VBB can be performed during operation. The substrate bias voltage VBB to be generated by a substrate bias voltage generator (which is not shown because it is not part of the invention) therefore also becomes independent of the supply potential VDD and its possible fluctuations.

FIG. 1 also shows a terminal for a second potential Vy. Generally, this potential is equal to the substrate bias voltage VBB. However, according to a particular embodiment of the invention to be described below, it is equal to a first supply potential VSS (which is typically referred to as ground, that is VSS=0 V) of the semiconductor circuit.

A Schmitt trigger circuit ST is disposed between the two potentials Vx, Vy. The output side of the Schmitt trigger circuit ST is followed by a first inverter array I1, which is connected in terms of supply voltage to the first potential Vx and the first supply potential VSS.

As is well known, each Schmitt trigger circuit has hysteresis in its switch behavior and its input is wired accordingly. In the present case, the input of the Schmitt trigger circuit is connected to the output of the first inverter array I1 for this purpose.

The essential elements of the present Schmitt trigger circuit ST are first, second and third series-connected resistor elements R1, R2, R3 in a resistor network RN, which taken as a whole are disposed between the two potentials Vx, Vy. A first circuit node 1 of the regulating circuit is created between the first and second resistor elements R1, R2, and a second circuit node 2 of the regulating circuit is created between the second and third resistor elements R2, R3. In FIG. 1, the resistor elements R1, R2, R3 are ohmic resistors.

A further essential element of the present Schmitt trigger circuit ST is a hysteresis transistor HT, which serves to control the hysteresis function of the Schmitt trigger circuit ST. The channel path of the hysteresis transistor HT is connected parallel to the first resistor element R1. In other words, its channel path is connected to the first potential Vx and to the first circuit node 1. The gate of the hysteresis transistor HT is a regulating input of the Schmitt trigger circuit ST which is connected to the output of the first inverter array I1 and forms a third circuit node 3 of the regulating circuit. In FIG. 1, the hysteresis transistor is of the p-channel type. In such a case, the first inverter array I1 includes an odd number of inverters, or in other words at least one inverter. On one hand, the provision of more than one inverter in the first inverter array I1 causes an amplification of the input signal arriving there and a greater steepness of the edge of its output signal, but on the other hand the level circuit requires more surface area. The substrate region of the hysteresis transistor HT shown in FIG. 1 is preferably likewise connected to the first potential Vx=VCC. The hysteresis transistor HT thus has a lower cutoff voltage than if its substrate region were connected to the second potential VDD, since Vx<VDD.

In FIG. 1, the first inverter array I1 is also followed by a second inverter array I2 through the third circuit node 3. The second inverter array I2 includes at least one inverter, as shown. In terms of supply voltage, the second inverter array I2 is connected to the two supply potentials VSS, VDD of the semiconductor circuit. A control signal SLIM is produced at the output of the second inverter array I2 as an output signal of the regulating circuit. This signal SLIM serves to control the substrate bias voltage generator that produces the substrate bias voltage VBB. However, the second inverter array I2 is not absolutely necessary for operation of the regulating circuit according to the invention, but instead it merely serves to amplify the signal present at the third circuit node 3. If the second inverter array I2 is omitted, the control signal SLIM is then already produced (although in a different phase position and with a different high level) at the third circuit node 3 (see FIG. 10).

The operation of the regulating circuit of FIG. 1 will now be described in further detail, by referring to the potential diagram of FIG. 13. Upon application of the supply potentials VSS, VDD to the semiconductor circuit, the regulated potential VCC (which is not a component of the regulating circuit and therefore is not shown), that is then applied as the first potential Vx to the regulating circuit, is built up. The substrate bias voltage VBB is first at the value of the first supply potential VSS and the substrate bias voltage generator begins to build up the substrate bias voltage VBB (which is negative as compared with the supply potentials VSS, VDD). The third circuit node 3 is at first still at the value of the first supply potential VSS, in other words it is at ground. The hysteresis transistor HT accordingly conducts, and thus electrically short-circuits the first resistor element R1.

Due to the voltage divider effect of the resistor network RN, a potential $$V_2 = Vx \cdot \frac{R3}{R2 + R3}$$

is initially present at the second circuit node 2. The substrate bias voltage VBB wa left out for the sake of simplicity, because its initial value is still approximately 0 V. More correctly, the formula would have to read as follows:

$$V_2 = (Vx - VBB) \cdot \frac{R3}{R2 + R3} .$$

Figure 13:
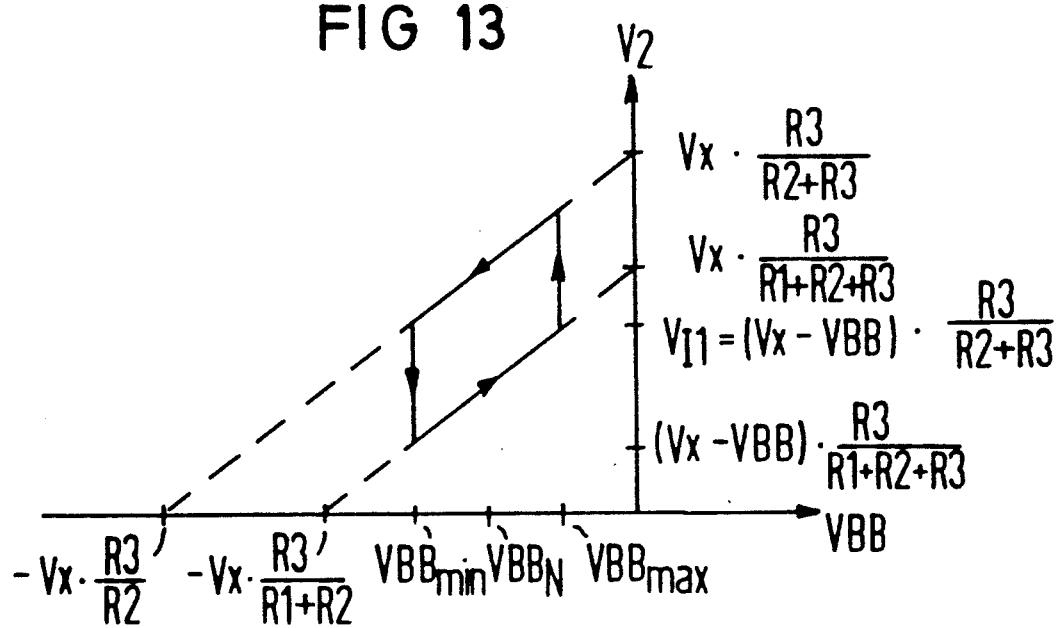
FIG. 13 is a potential diagram showing a regulating characteristic of the regulating circuit.

Since the substrate bias voltage VBB becomes increasingly negative, the potential $V_2$ at the circuit node 2 drops (compare the dashed line in FIG. 13). Initially the substrate bias voltage VBB attains a value $VBB_{max}$, which it then no longer exceeds during operation. At this time, the potential $V_2$ still has a value that is located above a value $V_{f1}$ that is equal to the voltage at which the first inverter array I1 assumes its complementary state ("switchover point"). The third circuit node 3 thus has a low potential state (=first supply potential VSS), so that because of the second inverter array I2, the control signal SLIM at the output of the regulating circuit has a high potential value (=second supply potential VDD), as a result of which the substrate bias voltage generator is assumed to continue in operation. The substrate bias voltage VBB thus becomes more and more negative, so that the potential $V_2$ at the second circuit node 2 drops further, to below the value $V_{f1}$. At that time, the substrate bias voltage VBB has a minimum value $VBB_{min}$, which it does not drop below during operation. As soon as the potential V at the second circuit node 2 drops below the value $V_{f1}$, the first inverter array I1 flips into its complementary state. In other words, the third circuit node 3 assumes the value of the first potential Vx (in terms of supply voltage, the first inverter array I1 is connected to the first potential Vx).

However, this blocks the hysteresis transistor HT, and the first resistor element R1 becomes operative, so that the potential $V_2$ at the second circuit node 2 drops to the value $$(Vx - VBB) \cdot \frac{R3}{R1 + R2 + R3} .$$

Since the potential at the third circuit node 3 then has the value of the first potential Vx as already indicated, the control signal SLIM correspondingly has a low value (=first supply potential VSS), because of the second inverter array I2. However, this turns off the substrate bias voltage generator, that is the substrate bias voltage VBB does not become any more negative.

Due to the leakage current losses that occur in every semiconductor circuit in terms of the substrate bias voltage VBB (for example, a quadrature-axis component of current between the first potential Vx and the substrate bias voltage VBB in the present circuit of FIG. 1 as well, depending on the dimensioning of the resistor elements R1, R2, R3), which usually, up to a certain extent, are even desirable (for instance, it can serve to limit the substrate bias voltage to the value $VBB_{min}$), the substrate bias voltage VBB then slowly rises again. The potential $V_2$ at the second circuit node 2 thus rises slowly as well, to above the value $V_{f1}$ at which the first inverter array I1 then resumes its original state. In other words, the third circuit node 3 resumes its low value (typically, it is equal to the value of the first supply voltage VSS, that is, 0 V). At that instant, the substrate bias voltage VBB is at its maximum value $VBB_{max}$. However, this makes the transistor HT conducting again, so that the potential $V_2$ at the second circuit node 2 assumes the value of $$(Vx - VBB) \cdot \frac{R3}{R2 + R3} .$$

At the same time, the control signal SLIM assumes its high value (=VDD) and thus turns the substrate bias voltage generator back on again. As a result, the substrate bias voltage VBB becomes increasingly more negative and the process already described above begins again. In FIG. 13, the course of the potential $V_2$ at the second circuit node 2 is plotted over time and represented by arrows.

Figure 2:
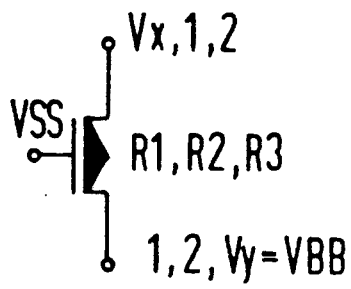
FIGS. 2-9 are schematic circuit diagrams showing advantageous details of components according to the invention.
Figure 4:
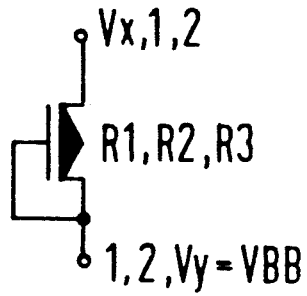

According to FIGS. 2 and 4, one, several or all of the resistor elements R1, R2, R3 may be constructed as p-channel transistors, having sources which are connected to the first potential Vx (R1), the first circuit node 1 (R2), or the second circuit node 2 (R3), and drains which are connected to the first circuit node 1 (R1), the second circuit node 2 (R2) or the second potential Vy, with the second potential Vy being in turn equal to the substrate bias voltage VBB. In the embodiment of FIG. 2, the gate is connected to the first supply potential VSS, while in the embodiment of FIG. 4, the gate is connected to the associated drain.

Figure 5:
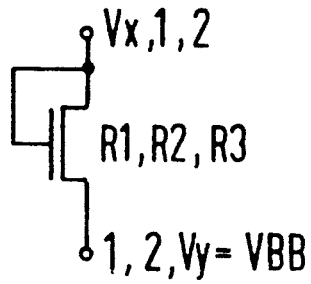
Figure 3:
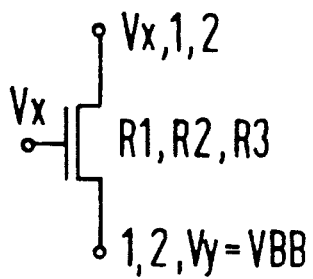

However, according to the exemplary embodiments of FIGS. 3 and 5, one, more or all of the resistor elements R1, R2, R3 may also be constructed as n-channel transistors, having drains which are connected to the first potential Vx (R1), the first circuit node 1 (R2), or the second circuit node 2 (R3), and sources which are connected to the first circuit node 1 (R1), the second circuit node 2 (R2) or the second potential Vy, with the second potential Vy being in turn equal to the substrate bias voltage VBB. In the embodiment of FIG. 3, the gate is connected to the first potential Vx, while in the embodiment of FIG. 5, the gate is connected to the associated drain.

Figure 6:
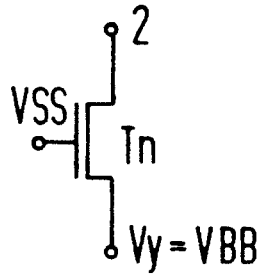

According to FIG. 6, the third resistor element R3 is an n-channel resistor Tn, which has an infinite resistance, even in the conducting state. The resistor Tn is connected to the substrate bias voltage VBB as the second potential Vy. The gate of this transistor Tn is connected to the first supply potential VSS.

Figure 7:
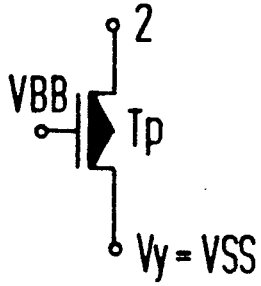

However, if the aforementioned quadrature-axis component of the current between the first potential Vx and the substrate bias voltage VBB through the resistor network RN to the second potential Vy=VBB is to be avoided, then an embodiment shown in FIG. 7 is especially suitable for this purpose: in FIG. 7, it is not the substrate bias voltage VBB but rather the first supply potential VSS of the semiconductor circuit that serves as the second potential Vy. A p-channel transistor Tp is provided as the third resistor element R3, which likewise has an infinite resistance in the conducting state and its gate is connected to the substrate bias voltage VBB. The influence of the present value of the substrate bias voltage VBB at a given time upon the potential conditions at the second circuit node 2 is thus exerted in this case not, as in the previously described embodiments, through the second potential Vy (which, of course, in this case is fixedly at the value of the first supply potential VSS), but rather through the gate of the p-channel transistor Tp, or in other words through its conducting capacity at the time, which of course can be controlled through the gate.

Figure 8:
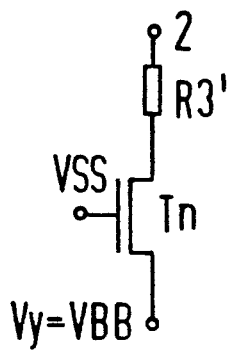
Figure 9:
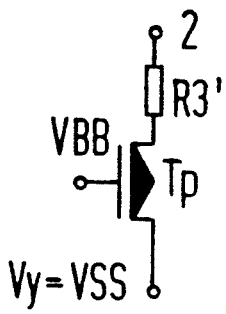

FIGS. 8 and 9 show the n-channel and p-channel transistors Tn, Tp of FIGS. 6 and 7, with each being expanded by one further resistor element R3', which is disposed between these transistors Tn, Tp and the second circuit node 2. With these embodiments, the potential conditions at the applicable second circuit node 2 can be more easily adapted to the requirements of regulation and thus to the regulating circuit.

Figure 10:
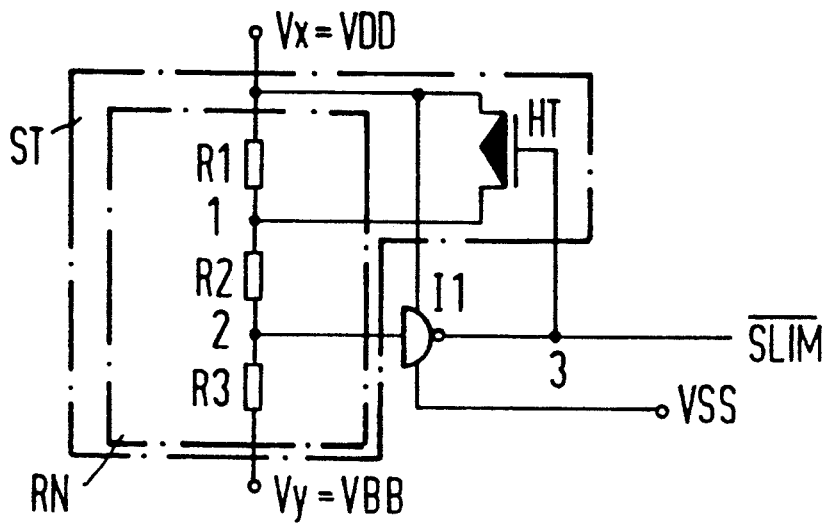

The embodiment of FIG. 10 differs from the embodiment of FIG. 1 in two aspects: first, it does not include any second inverter array I2. Instead, a control signal $\overline{\text{SLIM}}$ for the substrate bias voltage generator is already produced at the third circuit node 3. Accordingly, as compared with the control signal SLIM of FIG. 1, it has the opposite course over time, but this can easily be taken into account in the switching behavior of the substrate bias voltage generator.

Second, the first potential Vx has the value of the second supply potential VDD at the semiconductor circuit. The regulating circuit according to the invention functions with this provision as well. However, if the second supply potential VDD instead of a regulated voltage VCC is used as the first potential Vx, then the regulating circuit, and thus the control signal $\overline{\text{SLIM}}$ and the function of the substrate bias voltage generator as well, are influenced by the fluctuations that typically arise in the second supply potential VDD.

Figure 11:
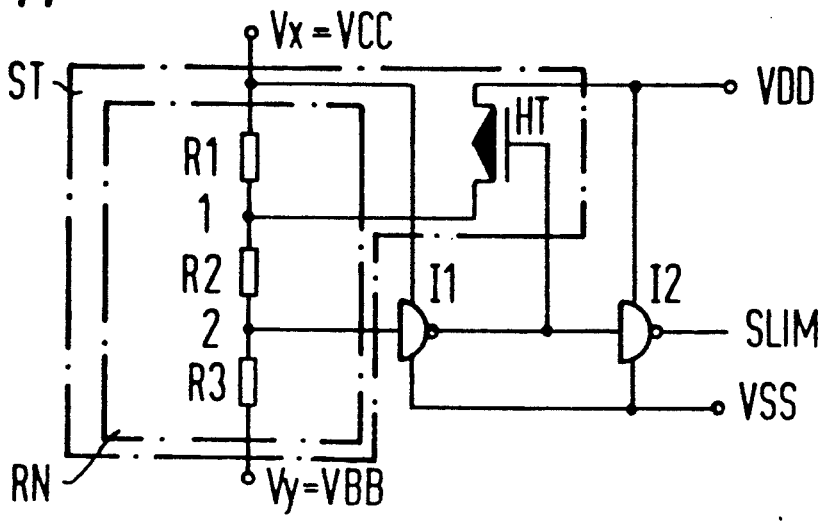

The embodiment of FIG. 11 differs from that of FIG. 1 only to the extent that the source of the hysteresis transistor HT is not connected to the first potential Vx=VCC but rather to the second supply potential VDD. However, that has the disadvantage already discussed above in conjunction with FIG. 10, and furthermore the hysteresis transistor HT is never entirely blocked, because the second supply potential VDD is never applied to its gate through the third circuit node 3. Instead, at a maximum the value of the first potential Vx=VCC, where VCC<VDD, is applied there.

Figure 12:
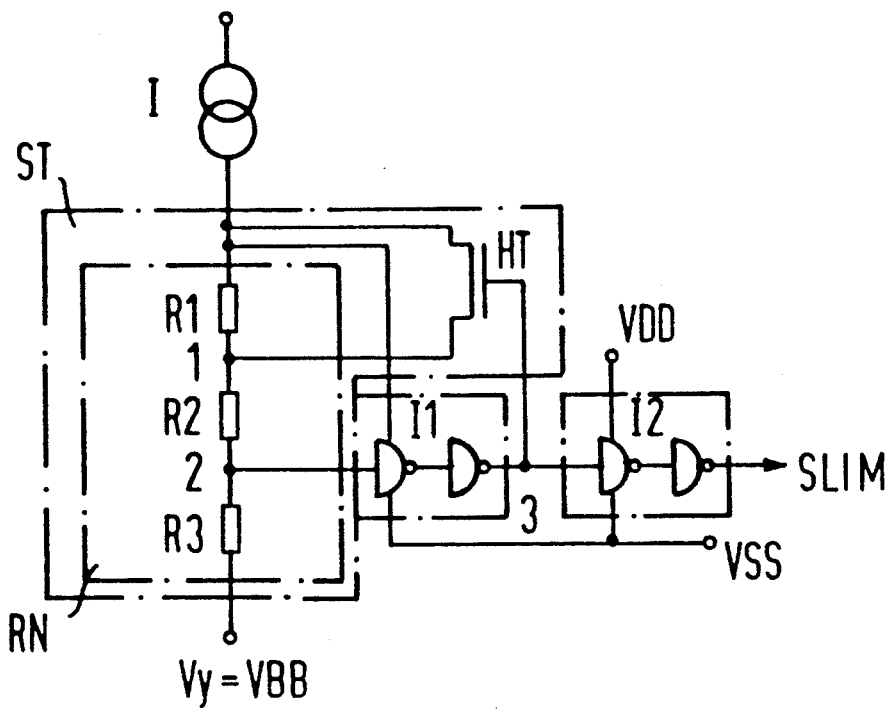

In the embodiment of FIG. 12, a constant current source I is used instead of the first potential Vx. This has the same advantages as the use of a regulated potential VCC as the first potential (see FIG. 1). The hysteresis transistor HT is constructed as an n-channel transistor. The first inverter array I1 therefore includes an even number of series-connected inverters, two of which are shown in FIG. 12. The second inverter array I2 also includes a series circuit of a plurality of inverters, which in the present case is once again a series circuit of two inverters. Thus a greater edge steepness and an amplified potential (third circuit node 3) or an amplified control signal SLIM can be attained at the third circuit node 3 and at the output of the regulating circuit.

The present invention has been described on the assumption that it is employed in a semiconductor circuit having a substrate material which is of the p-type. However, it is also applicable to semiconductor circuits with substrate material of the n-type. In such a case, the substrate bias voltage VBB is the most-positive of all of the potentials indicated. The polarities of the indicated potentials need merely be transposed, as do the conduction types for the transistors that are indicated. However, this presents no problems to one skilled in the art because he can easily convert the present disclosure accordingly, by using his professional competence.

We claim:

1. A regulating circuit for a switched substrate bias voltage generator for generating a controlled substrate bias voltage which fluctuates between first and second threshold values in an integrated semiconductor circuit, comprising:
  a Schmitt trigger circuit disposed between a first potential and a second potential of a semiconductor circuit, said
  Schmitt trigger circuit having an output side and an input for controlling a hysteresis function of said Schmitt trigger circuit;
  an inverter array connected downstream of the output side of said Schmitt trigger circuit, said inverter array being connected to the first potential and to a first supply potential of the semiconductor circuit in terms of supply voltage, and said inverter array having an output;
  the input of said Schmitt trigger circuit for controlling the hysteresis function of said Schmitt trigger circuit being connected to the output of said inverter array;
  means for turning off the substrate bias voltage generator when a given first threshold of the substrate bias voltage is reached, and for turning on the substrate bias voltage generator when a given second threshold of the substrate bias voltage is reached.

2. The regulating circuit according to claim 1, wherein said inverter array is a first inverter array, and including a second inverter array connected downstream of said first inverter array.

3. The regulating circuit according to claim 2, wherein said second inverter array is connected to the first supply potential and to a second supply potential of the semiconductor circuit in terms of supply voltage.

4. The regulating circuit according to claim 1, wherein the first potential is a second supply potential of the semiconductor circuit.

5. The regulating circuit according to claim 1, wherein the first potential is a regulated potential being lower than a second supply potential of the semiconductor circuit.

6. The regulating circuit according to claim 1, wherein said Schmitt trigger circuit includes a resistor network being disposed between the first potential and the second potential, said resistor network having at least first, second and third series-connected resistor elements, a first circuit node of the regulating circuit between said first resistor element and said second resistor element, and a second circuit node of the regulating circuit between said second resistor element and said third resistor element.

7. The regulating circuit according to claim 6, wherein at least one of said resistor elements is a transistor.

8. The regulating circuit according to claim 7, wherein said transistor of at least one of said resistor elements is of the p-channel type and has a gate connected to the first supply potential.

9. The regulating circuit according to claim 7, wherein said transistor of at least one of said resistor elements is of the n-channel type and has a gate connected to the first potential.

10. The regulating circuit according to claim 7, wherein said transistor of at least one of said resistor elements has a gate and a drain being interconnected.

11. The regulating circuit according to claim 6, wherein at least one of said resistor elements is an ohmic resistor.

12. The regulating circuit according to claim 1, wherein the second potential is a substrate bias voltage.

13. The regulating circuit according to claim 6, wherein said third resistor element is an n-channel transistor having a gate connected to the first supply potential.

14. The regulating circuit according to claim 6, wherein the second potential is the first supply potential, and said third resistor element is a p-channel transistor having a gate connected to a substrate bias voltage.

15. The regulating circuit according to claim 13, including at least one further resistor element disposed between said second circuit node and said third resistor element.

16. The regulating circuit according to claim 14, including at least one further resistor element disposed between said second circuit node and said third resistor element.

17. The regulating circuit according to claim 6, including a hysteresis transistor having a gate at the input of said Schmitt trigger circuit, for controlling the hysteresis function.

18. The regulating circuit according to claim 17, wherein said hysteresis transistor has a channel path disposed between the first potential and said first circuit node.

19. The regulating circuit according to claim 17, wherein said hysteresis transistor has a channel path disposed between the second supply potential and said first circuit node.

20. The regulating circuit according to claim 18, wherein said hysteresis transistor serves as said first resistor element having an finite resistance in a blocked state.

21. The regulating circuit according to claim 19, wherein said hysteresis transistor serves as said first resistor element having an finite resistance in a blocked state.

22. The regulating circuit according to claim 17, wherein said inverter array includes an odd number of inverters, and said hysteresis transistor is of the p-channel type.

23. The regulating circuit according to claim 17, wherein said inverter array includes an even number of inverters, and said hysteresis transistor is of the n-channel type.

24. The regulating circuit according to claim 2, wherein said second inverter array includes at least one inverter.

25. The regulating circuit according to claim 1, including a constant current source supplying the first potential.

* * * * *